US010638226B2

(12) United States Patent
(10) Patent No.: US 10,638,226 B2
(45) Date of Patent: Apr. 28, 2020

Paranjpe et al.

(54) SYSTEM AND METHOD FOR DETECTING AND INDICATING THAT AN AUDIO SYSTEM IS INEFFECTIVELY TUNED

(71) Applicants: BlackBerry Limited, Waterloo (CA); 2236008 Ontario Inc., Waterloo (CA)

(72) Inventors: Shreyas Anand Paranjpe, Vancouver (CA); Robert Joseph Soja, II, Linden, MI (US); Leonard Charles Layton, Vancouver (CA)

(73) Assignees: BlackBerry Limited, Waterloo, Ontario (CA); 2236008 Ontario Inc., Waterloo, Ontario (CA)

( * ) Notice: Subject to any disclaimer, the term of this patent is extended or adjusted under 35 U.S.C. 154(b) by 0 days.

(21) Appl. No.: 16/135,401

(22) Filed: Sep. 19, 2018

(65) Prior Publication Data

US 2020/0092645 A1 Mar. 19, 2020

(51) Int. Cl.
*G10K 11/16* (2006.01)
*H04R 3/04* (2006.01)
(Continued)

(52) U.S. Cl.
CPC ............ *H04R 3/04* (2013.01); *G10L 21/0208* (2013.01); *G10L 2021/02082* (2013.01);
(Continued)

(58) Field of Classification Search
CPC .. H04R 3/04; H04R 2400/01; H04R 2430/01; H04R 2499/13; G10L 21/0208; G10L 2021/02082
(Continued)

(56) References Cited

U.S. PATENT DOCUMENTS

| | | | |
|---|---|---|---|
| 9,743,207 | B1 | 8/2017 | Hartung |
| 9,794,710 | B1 | 10/2017 | Sheen |

(Continued)

FOREIGN PATENT DOCUMENTS

| | | | |
|---|---|---|---|
| EP | 3226575 | A1 | 10/2017 |
| WO | 2015067853 | A1 | 5/2015 |

OTHER PUBLICATIONS

EPO, Extended European Search Report relating to EP Application No. 19197800.6 dated Jan. 28, 2020.

*Primary Examiner* — Ammar T Hamid
(74) *Attorney, Agent, or Firm* — Rowand LLP

(57) ABSTRACT

A digital audio system, which may be an integrated audio system of a vehicle, includes a microphone, a loudspeaker, and a processor. The processor is operable to modify digital audio signals based on tuning parameters to compensate for acoustic characteristics of the environment. The processor is further operable to detect that modification of digital audio signals based on the tuning parameters cannot fully compensate for the acoustic characteristics of the environment. The detection is based on an audio signal corresponding to audio captured from the environment and/or on the values of the tuning parameters. Upon detecting that modification of digital audio signals based on the tuning parameters cannot fully compensate for the acoustic characteristics of the environment, an indication is provided that the audio system should be calibrated to adjust the tuning parameters to the environment. Related methods and computer-readable media are also disclosed.

20 Claims, 5 Drawing Sheets

(51) Int. Cl.
*G10L 21/0208* (2013.01)
*H03G 3/20* (2006.01)

(52) U.S. Cl.
CPC ...... *H04R 2400/01* (2013.01); *H04R 2430/01* (2013.01); *H04R 2499/13* (2013.01)

(58) Field of Classification Search
USPC ............................................ 381/71.1, 57, 58
See application file for complete search history.

(56) References Cited

U.S. PATENT DOCUMENTS

| | | | |
|---|---|---|---|
| 10,003,899 B2 | 6/2018 | Hartung et al. | |
| 2010/0316226 A1 | 12/2010 | Yoneda et al. | |
| 2013/0315405 A1 | 11/2013 | Kanishima et al. | |
| 2016/0011848 A1 * | 1/2016 | Wilberding ............ | H03G 5/005 715/716 |
| 2016/0014537 A1 * | 1/2016 | Lehnert ................ | H04R 29/008 381/58 |
| 2016/0309275 A1 | 10/2016 | Schevciw et al. | |
| 2017/0215016 A1 | 7/2017 | Dohmen et al. | |
| 2018/0035227 A1 | 2/2018 | Wilberding et al. | |

* cited by examiner

SYSTEM AND METHOD FOR DETECTING AND INDICATING THAT AN AUDIO SYSTEM IS INEFFECTIVELY TUNED

FIELD

This relates to digital audio systems and, more particularly, to digital audio systems that tune audio to compensate for acoustic characteristics of a playback and/or a recording environment.

BACKGROUND

Digital audio systems, also known as acoustic processing systems, may be employed in a variety of scenarios. For example, a digital audio system may serve as a hands-free telephony system. Digital audio systems may be tuned to compensate for their operating acoustical environment. In this way, optimal or near-optimal subjective and/or objective quality may be provided by correcting or adjusting for the acoustical environment.

For example, where the digital audio system is an integrated audio system of a vehicle (such as, for example, an integrated hands-free telephony system), it may be tuned for the particular type of vehicle. Such tuning may, for example, compensate for properties of the vehicle with acoustic effects such as, for example, the cabin size and/or the loudspeaker/microphone arrangements found in a particular vehicle model.

Same or similar audio systems may be deployed in different operating environments. For example, an in-vehicle audio system of one vehicle model may be the same or similar to that of another vehicle model. In such cases, re-tuning for the different environment may be required. A failure to properly retune may, however, not be readily apparent. Indeed, use of an ineffectively tuned system may not necessarily result in poor or suboptimal performance under best-case or even nominal circumstances. This could lead to a lack of tuning being undetected such as, for example, in the testing of production prototypes. Conversely, an ineffectively tuned system may fail under typical use cases in ways such that the root cause of the ineffective tuning may not be readily apparent.

BRIEF DESCRIPTION OF THE DRAWINGS

Reference will now be made, by way of example, to the accompanying drawings in which.

Like reference numerals are used in the drawings to denote like elements and features.

DETAILED DESCRIPTION

Figure 1:
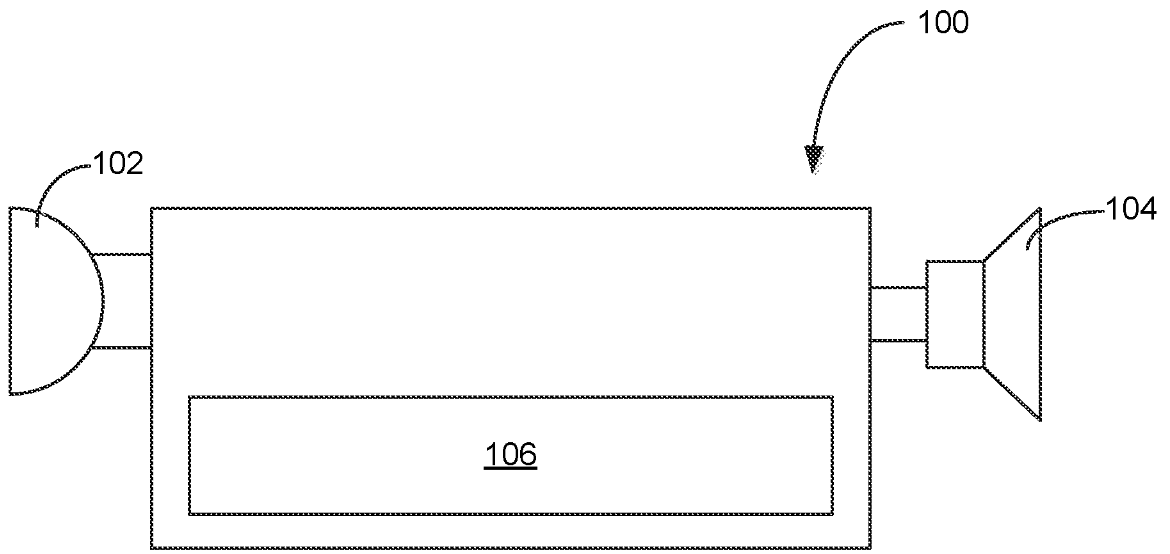
FIG. 1 illustrates a simplified block design of an example digital audio system.

According to the subject matter of the present application, there may be provided an audio system. The audio system may include at least one microphone, at least one loudspeaker, and a processor. The at least one microphone may be for capturing audio from an environment. The at least one loudspeaker may be for presenting audio to the environment. The processor may operable to modify digital audio signals based on a plurality of tuning parameters to compensate for acoustic characteristics of the environment, the digital audio signals corresponding to at least one of audio captured from the environment and audio to be presented in the environment. The processor may be further operable to detect, based on at least one of a particular digital audio signal corresponding to audio captured from the environment and values of the tuning parameters, that modification of digital audio signals based on the tuning parameters cannot fully compensate for the acoustic characteristics of the environment. The processor may be further operable to, upon detecting that, upon detecting that modification of digital audio signals based on the tuning parameters cannot fully compensate for the acoustic characteristics of the environment, provide an indication that the audio system should be calibrated to adjust the tuning parameters to the environment.

In this way, it may be determined that an audio system has not been effectively tuned. Conveniently, determining that an audio system has not been effectively tuned may allow deployment of such an ineffectively tuned system into production to be avoided. Additionally or alternatively, it may be that wasted effort, such as due to problem diagnosis or other debugging measures for mis-performance or failure of an untuned system, can be avoided.

In some implementations, detecting that modification of digital audio signals based on the tuning parameters cannot fully compensate for the acoustic characteristics of the environment may include comparing values of ones of the tuning parameters to default values; and determining, based on the comparing, that at least a threshold number of the ones of the tuning parameters are set to default values.

In some implementations, detecting that modification of digital audio signals based on the tuning parameters cannot fully compensate for the acoustic characteristics of the environment may include determining that values of a subset of the tuning parameters do not correspond to an expected statistical distribution.

In some implementations, detecting that modification of digital audio signals based on the tuning parameters cannot fully compensate for the acoustic characteristics of the environment includes determining that values of a subset of the tuning parameters correspond to an unexpected statistical distribution.

In some implementations, detecting that modification of digital audio signals based on the tuning parameters cannot fully compensate for the acoustic characteristics of the environment may include measuring a signal-to-noise ratio of the particular digital audio signal corresponding to audio captured from the environment; and determining that the signal-to-noise ratio is less than a threshold.

In some implementations, it may be that the audio system is further adapted to perform echo cancellation on the particular digital audio signal. It may be that performing echo cancellation includes measuring a coherence between a far-side reference signal and the particular digital audio signal. It may be that detecting that modification of digital audio signals based on the tuning parameters cannot fully compensate for the acoustic characteristics of the environment includes determining that the coherence is less than a threshold.

In some implementations, it may be that providing the indication that the audio system should be calibrated includes providing an audible indication via the at least one loudspeaker.

In some implementations, it may be that providing the indication that the audio system should be calibrated includes configuring the audio system to present audio at a reduced volume.

In some implementations, it may be that providing the indication that the audio system should be calibrated includes providing a visual indication.

In some implementations, it may be that providing the indication that the audio system should be calibrated includes sending a message via a network using a communications device.

In some implementation, the audio system may be an integrated audio system of a vehicle.

According to the subject matter of the present application, there may be provided a computer-implemented method. The method may include detecting, based on at least one of a particular digital audio signal corresponding to audio captured from an environment by an audio system and values of tuning parameters for use in modifying digital audio signals to compensate for acoustic characteristics of the environment, that modification of digital audio signals based on the tuning parameters cannot fully compensate for the acoustic characteristics of the environment. The method may further include, upon detecting that modification of digital audio signals based on the tuning parameters cannot fully compensate for the acoustic characteristics of the environment, providing an indication that the audio system should be calibrated to adjust the tuning parameters to the environment.

In some implementations, detecting that modification of digital audio signals based on the tuning parameters cannot fully compensate for the acoustic characteristics of the environment may include comparing values of ones of the tuning parameters to default values; and determining, based on the comparing, that at least a threshold number of the ones of the tuning parameters are set to default values.

In some implementations, detecting that modification of digital audio signals based on the tuning parameters cannot fully compensate for the acoustic characteristics of the environment may include determining that values of a subset of the tuning parameters do not correspond to an expected statistical distribution.

In some implementations, detecting that modification of digital audio signals based on the tuning parameters cannot fully compensate for the acoustic characteristics of the environment may include measuring a signal-to-noise ratio of the particular digital audio signal corresponding to audio captured from the environment; and determining that the signal-to-noise ratio is less than a threshold.

In some implementations, it may be that the audio system is further adapted to perform echo cancellation on the particular digital audio signal. It may be that performing echo cancellation includes measuring a coherence between a far-side reference signal and the particular digital audio signal. It may be that detecting that modification of digital audio signals based on the tuning parameters cannot fully compensate for the acoustic characteristics of the environment includes determining that the coherence is less than a threshold.

In some implementations, it may be that providing the indication that the audio system should be calibrated includes providing an audible indication and/or a visual indication.

In some implementations, it may be that providing the indication that the audio system should be calibrated includes configuring the audio system to present audio at a reduced volume.

In some implementations, it may be that providing the indication that the audio system should be calibrated includes sending a message via a network using a communications device.

According to the subject-matter of the present application there may be provided a non-transitory computer-readable storage medium storing instructions. The instructions, when executed by a processor may cause the processor to detect, based on at least one of a particular digital audio signal corresponding to audio captured from an environment by an audio system and values of tuning parameters for use in modifying digital audio signals to compensate for acoustic characteristics of the environment, that modification of digital audio signals based on the tuning parameters cannot fully compensate for the acoustic characteristics of the environment; and upon detecting that modification of digital audio signals based on the tuning parameters cannot fully compensate for the acoustic characteristics of the environment, provide an indication that the audio system should be calibrated to adjust the tuning parameters to the environment.

In some implementations, detecting that modification of digital audio signals based on the tuning parameters cannot fully compensate for the acoustic characteristics of the environment may include comparing values of ones of the tuning parameters to default values; and determining, based on the comparing, that at least a threshold number of the ones of the tuning parameters are set to default values.

In some implementations, detecting that modification of digital audio signals based on the tuning parameters cannot fully compensate for the acoustic characteristics of the environment may include determining that values of a subset of the tuning parameters do not correspond to an expected statistical distribution.

In some implementations, detecting that modification of digital audio signals based on the tuning parameters cannot fully compensate for the acoustic characteristics of the environment may include measuring a signal-to-noise ratio of the particular digital audio signal corresponding to audio captured from the environment; and determining that the signal-to-noise ratio is less than a threshold.

In some implementations, it may be that the audio system is adapted to perform echo cancellation on the particular digital audio signal. It may be that performing echo cancellation includes measuring a coherence between a far-side reference signal and the particular digital audio signal. It may be that detecting that modification of digital audio signals based on the tuning parameters cannot fully compensate for the acoustic characteristics of the environment includes determining that the coherence is less than a threshold.

In some implementations, it may be that providing the indication that the audio system should be calibrated includes providing an audible indication and/or a visual indication.

In some implementations, it may be that providing the indication that the audio system should be calibrated includes configuring the audio system to present audio at a reduced volume.

In some implementations, it may be that providing the indication that the audio system should be calibrated includes sending a message via a network using a communications device.

Other aspects and features of the present application will be understood by those of ordinary skill in the art from a review of the following description of examples in conjunction with the accompanying figures.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

FIG. 1 shows a simplified block design of an example digital audio system 100.

The example digital audio system 100 includes at least one microphone 102, at least one loudspeaker 104, and a computing device 106.

The example digital audio system 100 may correspond to an audio system of a particular application. For example, the digital audio system may be an audio system of a variety of vehicles—i.e., an integrated audio system of a vehicle. Vehicles includes motor vehicles (e.g., automobiles, cars, trucks, buses, motorcycles, etc.), aircraft (e.g., airplanes, unmanned aerial vehicles, unmanned aircraft systems, drones, helicopters, etc.), spacecraft (e.g., spaceplanes, space shuttles, space capsules, space stations, satellites, etc.), watercraft (e.g., ships, boats, hovercraft, submarines, etc.), railed vehicles (e.g., trains and trams, etc.), and other types of vehicles including any combinations of any of the foregoing, whether currently existing or after arising.

The example digital audio system 100 is situated in or in communication with an environment. The environment may correspond to the operating environment of the example digital audio system 100. For example, the environment may be the interior (e.g., the cabin) of a vehicle. One or both of the at least one microphone 102 and the at least one loudspeaker 104 may be situated in or in communication with the environment. In other words, the environment may be considered a "playback" and/or a "recording" environment. As further described below, the example digital audio system modifies digital audio signals based on a set of tuning parameters to compensate for acoustic characteristics of the environment.

The at least one microphone 102 includes one or more microphones. For example, the at least one microphone 102 may be an array of microphones such as, for example, an in-vehicle array of microphones where the environment is a vehicle cabin. The at least one microphone 102 is for capturing audio from the environment.

The at least one loudspeaker 104 includes one or more speakers. For example, the at least one loudspeaker 104 may be an array of speakers such as, for example, an in-vehicle set of speakers where the environment is a vehicle cabin. The at least one loudspeaker 104 is for presenting audio to the environment.

The computing device 106 is coupled to and in communication with at least one microphone 102 and the at least one loudspeaker 104. As further described below, the computing device 106 includes a hardware processor operable to modify digital audio signals based on a set of tuning parameters to compensate for acoustic characteristics of the environment.

The computing device 106 will now be described with reference to FIG. 2 which provides a simplified high-level block diagram of the computing device 106.

The computing device 106 includes a variety of modules. For example, as illustrated, the computing device 106 may include a processor 210, a memory 220, a communications subsystem 230, and/or an I/O subsystem 240. As illustrated, the foregoing example modules of the computing device 106 are in communication over a bus 250.

The processor 210 is or includes a hardware processor and may, for example, be or include one or more processors using ARM, x86, MIPS, or PowerPC™ instruction sets. For example, the processor 210 may be or include Qualcomm™ Snapdragon™ processors, Intel™ Core™ processors, or the like.

The memory 220 may include random access memory, read-only memory, persistent storage such as, for example, flash memory, a solid-state drive or the like. Read-only memory and persistent storage are a computer-readable medium and, in particular, may be considered examples of non-transitory computer-readable storage media. A computer-readable medium may be organized using a file system such as may be administered by an operating system governing overall operation of the computing device 106.

The communications subsystem 230 allows the computing device 106 to communicate with other computing devices and/or various communications networks. For example, the communications subsystem 230 may allow the computing device 106 to send or receive communications signals. Communications signals may be sent or received according to one or more protocols or according to one or more standards. For example, the communications subsystem 230 may allow the computing device 106 to communicate via a cellular data network, such as for example, according to one or more standards such as, for example, Global System for Mobile Communications (GSM), Code Division Multiple Access (CDMA), Evolution Data Optimized (EVDO), Long-term Evolution (LTE) or the like. Additionally or alternatively, the communications subsystem 230 may allow the computing device 106 to communicate via Wi-Fi™, using Bluetooth™ or via some combination of one or more networks or protocols. All or a portion of the communications subsystem 230 may be integrated into a component of the computing device 106. For example, the communications subsystem may be integrated into a communications chipset.

The I/O subsystem 240 provides for input to and output from the computing device 106. The I/O subsystem 240 may be coupled to and/or in communication with one or more input or output devices. For example, the I/O subsystem 240 may serve to couple the computing device 106 to the at least one microphone 102 (FIG. 1) and/or the at least one loudspeaker 104 (FIG. 1), either directly or indirectly such, as for example, through suitable analog and/or digital electronics such as, for example, an amplifier, a pre-amplifier, one or more filters, etc. In a particular example, the I/O subsystem 240 may include or may be in communication with an analog-to-digital convertor (ADC) and/or a digital-to-analog convertor (DAC) such as may allow analog audio signals to be converted digital audio signals and vice-versa, respectively. For example, the at least one microphone 102 may provide analog signals that are converted to digital audio signals by way of an ADC. In another example, the at least one loudspeaker 104 may be adapted to receive analog signals and such signals may be provided based on digital audio signals by way of a DAC.

Software comprising instructions is executed by the processor 210 from a computer-readable medium. For example, software may be loaded into random-access memory from persistent storage of the memory 220. Additionally or alternatively, instructions may be executed by the processor 210 directly from read-only memory of the memory 220.

Figure 2:
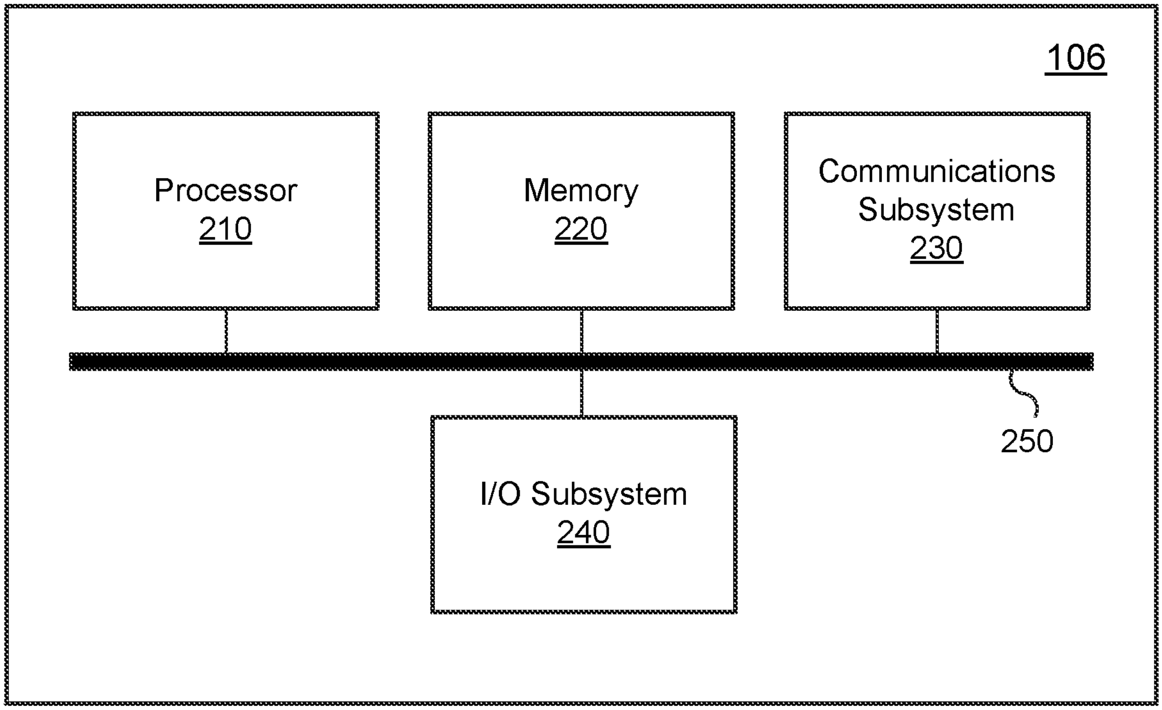
FIG. 2 shows a simplified high-level block diagram of a computing device of the example digital audio system of FIG. 1.
Figure 3:
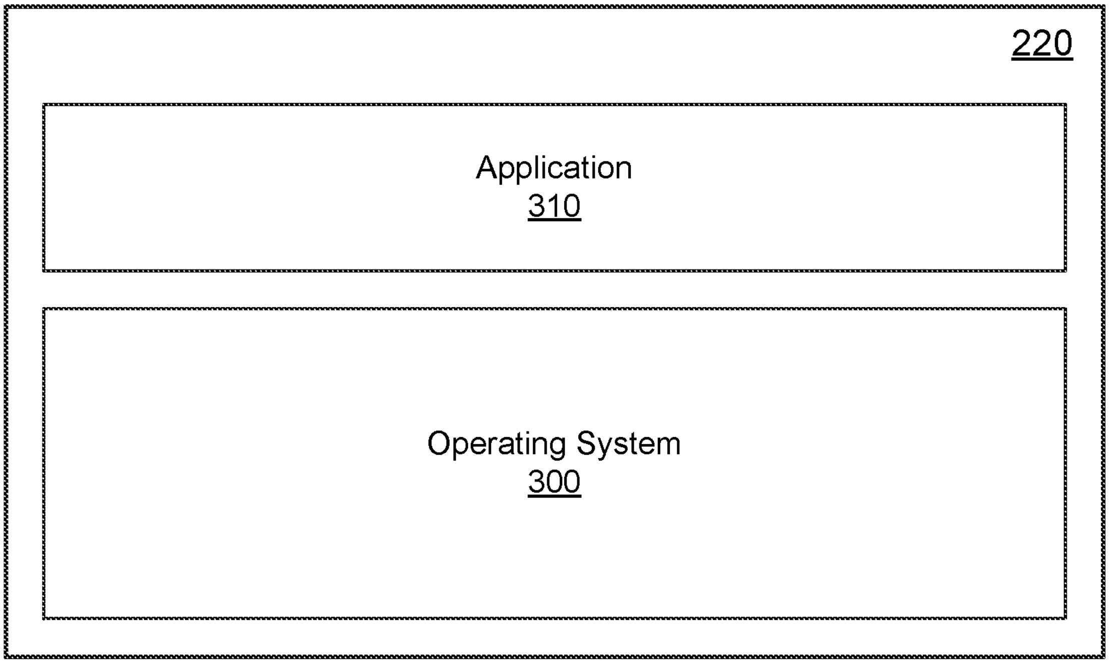
FIG. 3 depicts a simplified software organization of the computing device of FIG. 2.

FIG. 3 depicts a simplified organization of software components stored in the memory 220 of the computing device 106 (FIGS. 1, 2). As illustrated these software components include an operating system 300 and an application 310.

The operating system 300 comprises software and may comprise, for example, software such as, for example, QNX™, Android™, Linux™, Apple™ iOS™, Microsoft™ Windows™, or the like. The operating system 300 controls the overall operation of the computing device 106 (FIGS. 1, 2) and allows the application 310 to access the processor 210 (FIG. 2), the memory 220, the communications subsystem 230, and the I/O subsystem 240.

The application 310, comprises software that, in combination with the operating system 300, adapts the computing device 106 (FIGS. 1, 2) to operate as a device for various purposes. For example, the application 310 may cooperate with the operating system 300 to adapt the computing device 106 to compensate for acoustic characteristics of a playback and recording environment of the example digital audio system 100 (FIG. 1) under control of the processor 210 (FIG. 2).

As mentioned above, the example digital audio system 100 (FIG. 1), and, in particular, the computing device 106 and, in particular, the processor 210 (FIG. 2) of the computing device 106 (FIG. 1), may modify digital audio signals based on a set of tuning parameters to compensate for acoustic characteristics of the environment. For example, the processor 210 of the example digital audio system 100 may modify digital audio signals corresponding to audio captured from the environment (such as by way of the at least one microphone 102) and/or audio to be presented in the environment (such by way of the at least one loudspeaker 104) to compensate for the acoustic characteristics of the environment. Acoustic characteristics of the environment may include, for example, measures of sound absorption (potentially with respect to frequency), measures of sound reflectance (potentially with respect to frequency), measures of reverberation, and the like. In addition to and/or as an alternative to reflecting such environmental characteristics, tuning parameters and values thereof may be reflective of impacts of such acoustic characteristics of the environment on aspects of the example digital audio system 100 such as, for example, the at least one microphone 102 and/or the at least one loudspeaker 104 when disposed in the environment. For example, tuning parameters may reflect characteristics of a microphone or loudspeaker array such as if the at least one microphone 102 and/or the at least one loudspeaker 104 includes more than one microphone and/or more than one loudspeaker, respectively. Additionally or alternatively, the tuning parameters and values thereof may represent configuration values associated with various features of the example digital audio system 100. For example, some or all of the tuning parameters may be tuning parameters of an echo canceller.

In order for modification based on the tuning parameters to fully compensate for the acoustic characteristics of the environment, the tuning parameters must be set to values reflective of the acoustic characteristics of the environment and/or of compensations or adjustments necessary to compensate for such acoustic characteristics. Such a setting of the values of tuning parameters may be referred to as a tuning or calibration of the example digital audio system 100.

A failure to perform such a tuning and/or a deficient or defective tuning in which improper values are chosen may result in undesired operation of the example digital audio system 100. In particular, the above-mentioned modification of digital audio signals may fail to fully or effectively compensate for the acoustic characteristics of the environment when the example digital audio system 100 improperly tuned (untuned).

For example, such an untuned audio system may appear to function under best-case or even nominal circumstances. This may then lead to a false sense of security that all is well even though such a system may not operate properly outside such best-case or nominal circumstances, potentially exhibit undesired performance in only slightly challenging (but, potentially typical) circumstances or use cases. Potentially where such an untuned system is or is incorporated into a prototype, such a false sense of security could lead to release of an ineffectively tuned system into production.

In another example, the example digital audio system 100 failing to effectively compensate for the acoustic characteristics of an environment due to improper tuning may lead to wasted time and/or resources due to diagnosis or debugging directed to troubleshooting undesired operation that may have, as its root cause the lack of a proper tuning, especially if such an improper tuning is not readily apparent.

The subject matter of the present application provides for detecting a failure to tune and/or a deficient or defective tuning of the example digital audio system 100. In this way, an indication that the example digital audio system 100 is improperly tuned may be provided.

Figure 4:
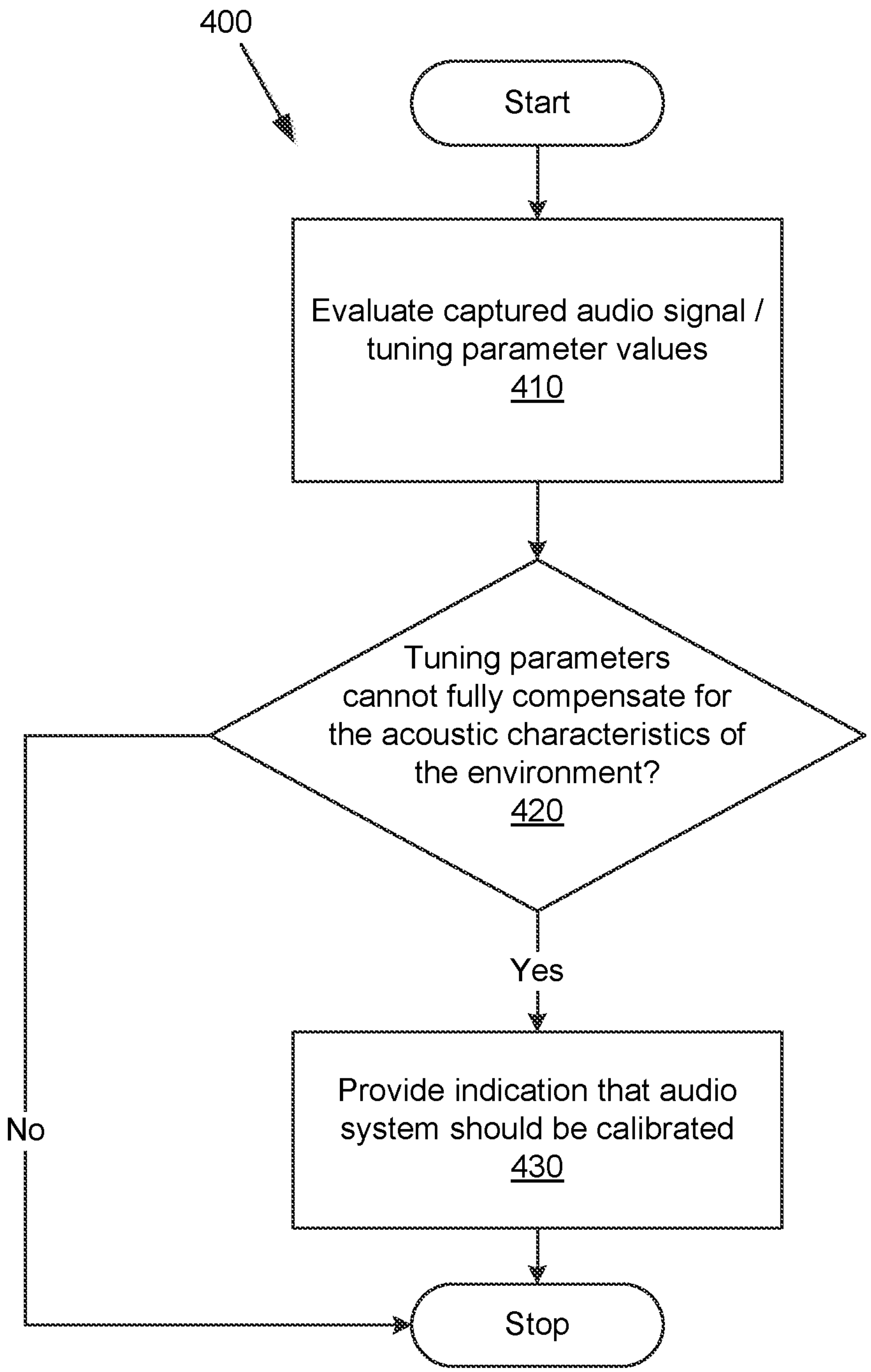
FIG. 4 is a flowchart illustrating an example method of the example digital audio system of FIG. 1.

The operation of the example digital audio system 100 in detecting an improper tuning and providing indication thereof will now be described with reference to a flowchart 400 of FIG. 4. Operations 410 and onward are performed by the processor 210 of the computing device 106.

As mentioned above, modification of digital audio signals to compensate for acoustic characteristics of the environment of the example digital audio system 100 is based on a set of tuning parameters.

At the operation 410, the processor 210 performs an analysis to of one or more captured audio signals and/or one or more of the values of the tuning parameters with a view to determining whether the modification of digital audio signals based on the tuning parameters and, in particular, based on the values thereof, can fully compensate for the acoustic characteristics of the environment. For example, a digital audio signal corresponding to audio captured from the environment such as, for example, a digital audio signal as may have been captured using the at least one microphone 102, may be evaluated. In other words, the analysis may evaluate such a digital audio signal. In another example, values of the tuning parameters may, additionally or alternatively, be evaluated. In other words, the analysis may, additionally or alternatively, evaluate tuning parameter values. Following the operation 410, an operation 420 is next.

At the operation 420, further to the analysis and evaluation at the operation 420, it is determined whether the modification of digital audio signals based on the tuning parameters can fully compensate for the acoustic characteristics of the environment.

If it is determined that the modification of digital audio signals based on the tuning parameters cannot fully compensate for the acoustic characteristics of the environment (e.g., as may be reflective of the example digital audio system 100 having not been calibrated or having been improperly calibrated) then, further to this detection, an operation 430 is next.

Alternatively, if it is determined that the modification of digital audio signals based on the tuning parameters can fully compensate for the acoustic characteristics of the environment then, further to this detection, control flow may terminate. This may, for example, be the case if the detection is based entirely on the values of the tuning parameters. Alternatively, such as, for example, where the detection of improper tuning includes evaluation of digital audio signals, control may return to the operation 410. Conveniently, in this way, an untuned system may be detected even if the lack of tuning is not detected based on a first audio signal that is evaluated. Notably, for example, a lack of tuning may only be detected in audio signals reflective of effects of an improper tuning. Accordingly, consideration of a second audio signal (or potentially even further audio signals) may improve the detection of improper tuning.

Example manners of detecting improper tuning will now be discussed.

In a first example of a manner of detecting improper tuning, it may be that, by default tuning parameters are set to nominal or default values. Such default values may or may not be operable in all circumstances. For example, default values may perform well in best case circumstances for most applications or environments in which the example digital audio system 100 may be deployed but may fail in more challenging circumstances or environments. Accordingly, it may be that detecting that modification of digital audio signals based on the tuning parameters cannot fully compensate for the acoustic characteristics of the environment includes an evaluation of the values of various of the tuning parameters. In a particular example, some or all of the tuning parameters may be compared to their respective default values. Then, based on that comparing of ones of the tuning parameters to default values, it may be determined that at least a threshold number of the tuning parameters are set to default values. Such a determination may be considered reflective of a failure to properly tune the system.

The threshold may be chosen in a variety of manners.

For example, it may be that particular ones of the tuning parameters are known to always be set, in a tuned system, to values different from their respective defaults. Accordingly, a lack of tuning may be detected based some of all of those ones of the tuning parameters being set to their default values.

In another example, it may be that most of the tuning parameters (or a most of a subset of the tuning parameters) can be expected to be set to values different from their respective defaults in a tuned system. Accordingly, a lack of tuning may be detected based on those ones of the tuning parameters (or a threshold percentage thereof, e.g., 50 percent) being set to their default values.

In a second example of a manner of detecting improper tuning, it may be that, when tuned, one or more groups of tuning parameters can be expected to have values reflective of particular statistical distributions. For example, it may be expected that a noise reduction (NR) attenuation parameter falls within an expected range such as, for example, between about 8 dB and 15 dB. As such, values of NR attenuation tuning parameters falling outside such a range may be considered indicative of improper tuning. In summary, detecting that modification of digital audio signals based on the tuning parameters cannot fully compensate for the acoustic characteristics of the environment may include determining that values of a subset of the tuning parameters do not correspond to such an expected statistical distribution.

It may, additionally or alternatively, be that, when untuned, one or more groups of tuning parameters can be expected to have values reflective of other particular statistical distributions. For example, where the tuning parameters include boost and/or cut parameters for various equalizer (EQ) nodes, it may be expected that such values are clustered at or about maximum boost and/or cut values. Accordingly, statistical measures of EQ boost/cut values indicative of such a clustering may be considered indicative of proper tuning. In summary, detecting that modification of digital audio signals based on the tuning parameters cannot fully compensate for the acoustic characteristics of the environment may include determining that values of a subset of the tuning parameters correspond to an unexpected statistical distribution.

In a third example of a manner of detecting improper tuning, it may be that the example digital audio system 100 can measure a signal-to-noise ratio of a digital audio signal. As such, a signal-to-noise ratio may be measured for the digital audio signal corresponding to audio captured from the environment. A lack of tuning may then be detected based on the signal-to-noise ratio. For example, the signal-to-noise ratio may be required to be greater than a threshold for the example digital audio system 100 to be considered effectively tuned. In a particular example, a signal-to-noise ratio of less than 5 dB may, in some embodiments, be considered reflective of a lack of tuning.

In a fourth example of a manner of detecting improper tuning, it may be that the example digital audio system 100 can perform echo cancellation on captured audio signals. Such echo cancellation may involve measuring a coherence or degree-of-similarity between a far-side reference signal and a digital audio signal corresponding to audio captured from the environment. A lack of tuning may be determined based on the degree of coherence. For example, if a measure of coherence is consistently low when there is only echo—i.e., when the remote signal is active while audio sources in the environment (e.g., speakers in the environment) are relatively silent—then the echo canceller is not working properly and this may be considered indicative of improper tuning.

Figure 5:
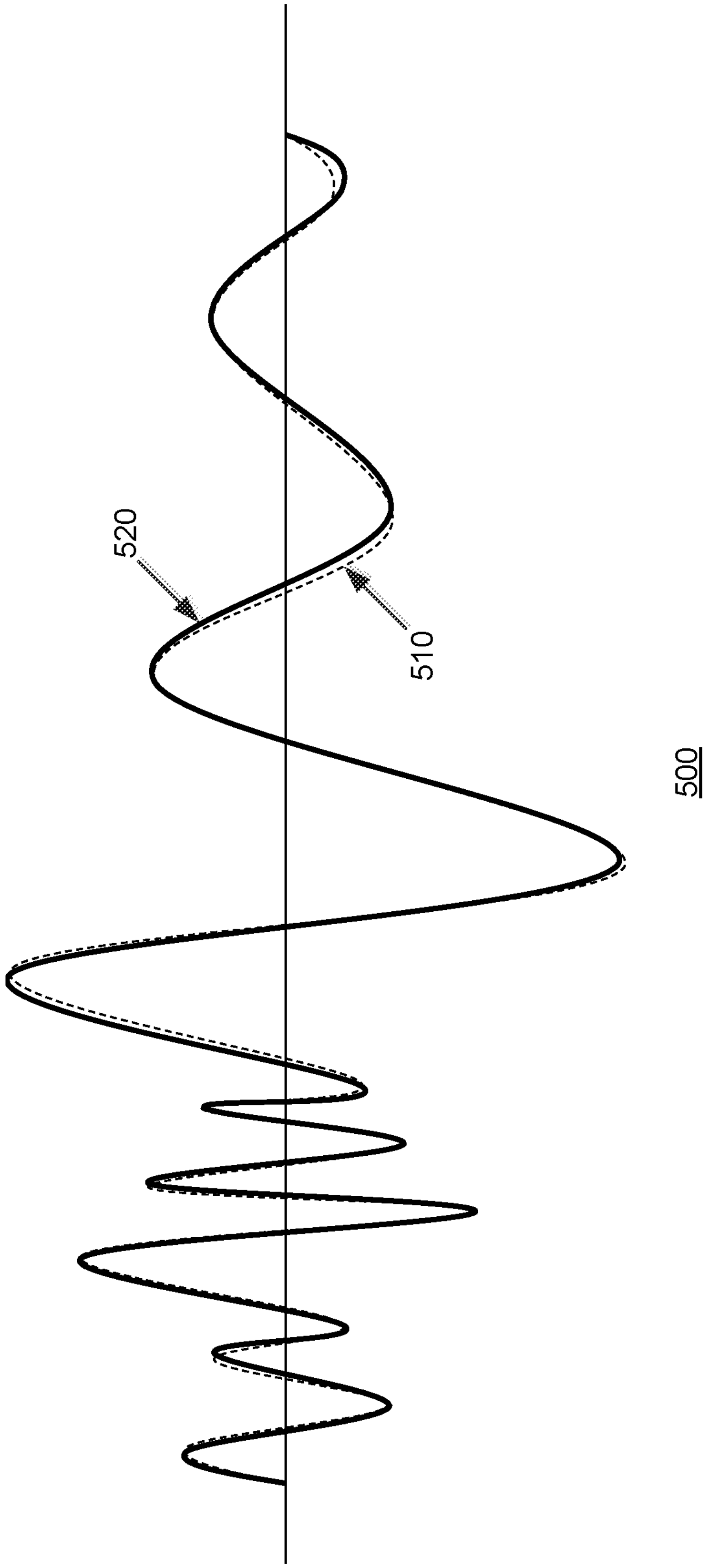
FIG. 5 is a plot showing an example digital audio signal and an example far-side reference signal.

For example, FIG. 5 provides a plot 500 showing an example digital audio signal 510 and an example far-side reference signal 520. (It may be that the example digital audio signal 510 and/or the example far-side reference signal 520 has been scaled so that they, as shown, roughly correspond in dynamic range.)

The example digital audio signal 510 may correspond to a signal captured by the example digital audio system 100 and the example far-side reference signal 520 may correspond to a far-side reference signal of the echo canceller of the example digital audio system 100.

As illustrated, the example digital audio signal 510 largely tracks the example far-side reference signal 520. As such, it may be said that they have a high degree of correlation. This may be considered reflective of the example digital audio system 100 having been properly tuned.

Figure 6:
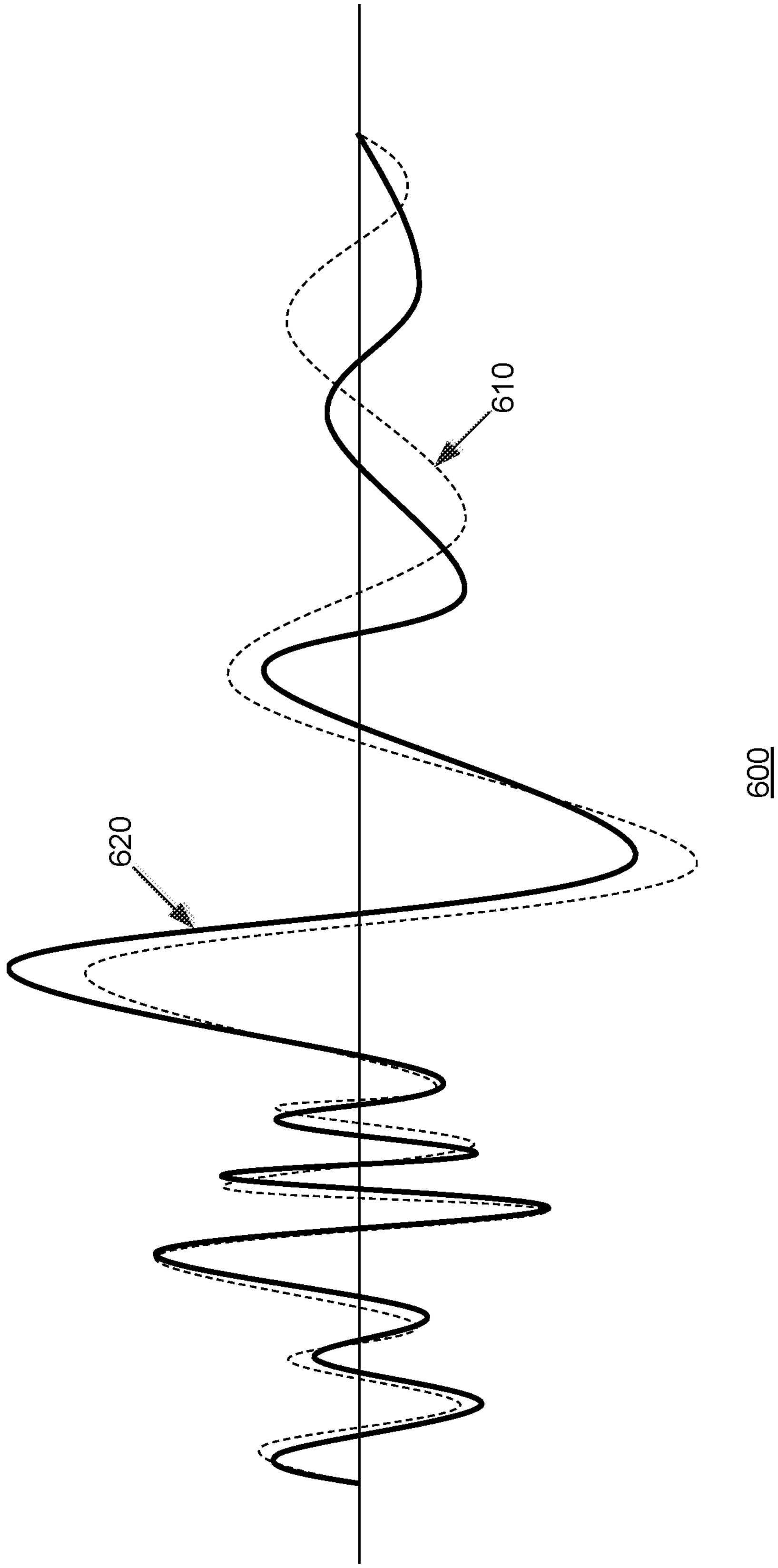
FIG. 6 is a plot showing another example audio signal and another example far-side reference signal.

In another example, FIG. 6 provides a plot 600 showing another example. In particular the plot 600 shows an example digital audio signal 610 and an example far-side reference signal 620. (Again, the example digital audio signal 610 and/or the example far-side reference signal 620 may have been scaled.)

The example digital audio signal 610 may correspond to a signal captured by the example digital audio system 100 and the example far-side reference signal 620 may correspond to a far-side reference signal of the echo canceller of the example digital audio system 100.

As illustrated, the example digital audio signal 610 diverges from the example far-side reference signal 620. As such, it may be said that they have a poor degree of correlation. This may be considered reflective of the example digital audio system 100 having not been tuned or having been improperly tuned. Such a lack of tuning may be detected based on, for example, a correlation between the example digital audio signal 510 and the example far-side reference signal 620 being less than a threshold. For example, the threshold could require a correlation of 0.85 between the signals, with correlations falling below that threshold being considered indicative of a lack of proper tuning.

In a particular example, when audio sources in the environment (e.g., speakers) are relatively silent while the far-side signal is active (e.g., being played through the at least one loudspeaker 104), then the at least one microphone 102 should be measuring echo only. If the coherence is consistently low while such circumstances exist, then the echo canceller is not functioning properly and this may be considered indicative of improper tuning. Put differently, it is expected that, with proper tuning, the coherence should be high.

Other measures of echo canceller performance may, additionally or alternatively, be evaluated in the detection of possible improper tuning. For example, with proper tuning it may be expected that echo will generally be attenuated. Accordingly, measures indicative of echo "leaking though" into the far side may, additionally or alternatively, be considered indicative of improper tuning.

In a fifth example of a manner of detecting improper tuning, it may be that one or more other audio anomalies are monitored for and potentially detected. Anomalies in an analyzed digital audio signal may be considered reflective of a lack of tuning. In a particular example, it may be that a machine learning algorithm is deployed and trained using a training set of tuned and untuned audio signals. Based on this, it may be that a model is deployed that, when provided with one or more audio signals, is able to determined whether such audio signal(s) are reflective of an untuned system. Additionally or alternatively, such a machine learning algorithm may be trained using values of tuning parameters of tuned and untuned digital audio systems and may detect a lack of tuning based on values of tuning parameters.

In a sixth example of a manner of detecting improper tuning, it may be that one or more techniques including, potentially, one or more of the example techniques disclosed above, are combined. For example, it may be that detection of a lack of tuning according to more than one technique is required to detect a lack of tuning. In a particular example, such a combination of techniques may require that all of the techniques being considered detect a lack a tuning or that at least a threshold number of the techniques being employed detect a lack of tuning such as, for example, a plurality of the techniques being applied. In another example, it may be that a lack of tuning is detected if at least one of the techniques being applied detects such a condition. Notably, requiring detection of a lack of tuning based on more than one technique may improve accuracy of detection and could serve to avoid false positives. By contrast, indicating a lack of tuning if only one or a minority of techniques being employed suggest a lack of tuning may avoid false negatives. Either may be an appropriate trade-off in a particular application. In some applications, an indication of a degree of certainty of detection of a lack of tuning may be provided (such as, for example, by way of a suitable visual indication—e.g., an amber indicator vs, a red indicator or a numerical value) and such certainty may be based on the number of and/or the particular ones of the techniques being employed that are suggesting a lack of tuning.

Conveniently, one or more of the above ways of providing an indication that the audio system should be calibrated may make it apparent that calibration is required. At the very least, even with less express indications such as, for example, the reduced output volume, even a naive listener may led to consider that something is "not quite right" and that the system needs to be investigated.

Returning to FIG. 4, as mentioned above, if a lack of tuning (i.e., that the tuning parameters cannot fully compensate for the acoustic characteristics of the environment) is detected then, following the operation 420, the operation 430 is next.

At the operation 430, an indication that the audio system should be calibrated to adjust the tuning parameters to the environment is provided.

Such an indication may take a variety of forms.

In a first example, the provided indication may include an audible indication. An audible indication may be or provided, for example, by way of the at least one loudspeaker 104. An audible indication may include one or more of a spoken warning (e.g., "Audio System is Untuned") such as may be provided via recorded voice or text-to-speech) and a beep, a klaxon or some other warning sound or a series of such sounds.

In a second example, the provided indication may include configuring the example digital audio system 100 to present audio at a reduced volume. For example, the average volume of audio provided by way of the at least one loudspeaker 104 may be lowered such as, for example, by reducing the gain setting of an associated amplifier.

In a third example, the provided indication may be visual. Such a visual indication may, for example, include an indication via a display. Additionally or alternatively, an indicator lamp may be illuminated. For example, where the example digital audio system 100 is an integrated audio system of a vehicle, a dashboard indicator light or "tell-tale" may be illuminated indicating the need for calibration or, potentially, a more general encompassing condition such as, for example, an audio system fault.

In a fourth example, a network connection such as, for example, a cellular or Internet connection may be used to provide an indication such as, for example, an email, a text message (SMS) or the like. Such indications may, for example, be provided by way of the communications subsystem 230 (FIG. 2) of the computing device 106. In another example, such indications may, additionally or alternatively, be provided by way of some other communications device. Such an indication may be particular effective in scenarios where the example digital audio system 100 is deployed in a test environment. For example, such network indications may be sent to relevant personnel such as, for example, a tuning engineer, an infotainment or hands-free telephony system manager, and/or the like. Furthermore, it may be that in addition or as an alternative to sending such an indication, a centralized server that tracks problem issues may be provided a warning notification so that a problem resolution management or bug tracking system can be updated. In this way, information may be provided to relevant team members regarding digital audio system(s) lacking calibration.

In a fifth example, one or more techniques for providing an indication may be used in combination. In a particular example, one or more of the above disclosed example techniques may be used in providing various manners of indication in combination. In some embodiments, the manner(s) of indication may be configurable such as, for example, by way of a configuration setting or file.

As mentioned above, the subject matter of the present application may have application where the example digital audio system 100 is employed in a pre-production or testing scenario. However, it may be that, additionally or alternatively, the subject matter of the present application is deployed or employed in a production environment. For example, the above-described techniques may be employed to detect where a production digital audio system no longer has an appropriate tuning not due to a lack of tuning prior to deployment but rather, additionally or alternatively, due to a failure of the system or a change in the environment. In a particular example, it may be that one or more of the microphones or loudspeakers of such a system has been damaged or replaced. In another example, it may be that changes have been made to the environment. For example, in the case of a vehicle audio system, it could be that the interior of the vehicle has been modified in such a way as to modify its acoustic characteristics such as, for example, by non-factory vehicle customizations (e.g., to upholstery or the like). Deployment of the subject matter of the present application in the case of the audio system of production vehicles could, for example, include the provision of "check audio system" "tell-tale" or indicator lamps in the vehicles. Conveniently, such an indicator may not only provide an indication of a digital audio system fault but may also allow users to potentially discern that particular vehicle customizations are a cause of poor audio performance such as, for example, based on customizations made before an indication was provided.

The various embodiments presented above are merely examples and are in no way meant to limit the scope of this application. Variations of the innovations described herein will be apparent to persons of ordinary skill in the art, such variations being within the intended scope of the present application. In particular, features from one or more of the above-described example embodiments may be selected to create alternative example embodiments including a sub-combination of features which may not be explicitly described above. In addition, features from one or more of the above-described example embodiments may be selected and combined to create alternative example embodiments including a combination of features which may not be explicitly described above. Features suitable for such combinations and sub-combinations would be readily apparent to persons skilled in the art upon review of the present application as a whole. The subject matter described herein and in the recited claims intends to cover and embrace all suitable changes in technology.

What is claimed is:

1. An audio system comprising:
- at least one microphone for capturing audio from an environment;
- at least one loudspeaker for presenting audio to the environment; and
- a processor operable to modify digital audio signals based on a plurality of tuning parameters to compensate for acoustic characteristics of the environment, the digital audio signals corresponding to at least one of audio captured from the environment and audio to be presented in the environment, wherein the processor is further operable to:
- detect, based on at least one of a particular digital audio signal corresponding to audio captured from the environment and values of the tuning parameters, that modification of digital audio signals based on the tuning parameters cannot fully compensate for the acoustic characteristics of the environment, wherein detecting that modification of digital audio signals based on the tuning parameters cannot fully compensate for the acoustic characteristics of the environment includes:
  - comparing values of ones of the tuning parameters to default values, and
  - determining, based on the comparing, that at least a threshold number of the ones of the tuning parameters are set to default values; and
- upon detecting that modification of digital audio signals based on the tuning parameters cannot fully compensate for the acoustic characteristics of the environment, provide an indication that the audio system should be calibrated to adjust the tuning parameters to the environment.

2. An audio system comprising:
- at least one microphone for capturing audio from an environment;
- at least one loudspeaker for presenting audio to the environment; and
- a processor operable to modify digital audio signals based on a plurality of tuning parameters to compensate for acoustic characteristics of the environment, the digital audio signals corresponding to at least one of audio captured from the environment and audio to be presented in the environment, wherein the processor is further operable to:
- detect, based on at least one of a particular digital audio signal corresponding to audio captured from the environment and values of the tuning parameters, that modification of digital audio signals based on the tuning parameters cannot fully compensate for the acoustic characteristics of the environment, wherein detecting that modification of digital audio signals based on the tuning parameters cannot fully compensate for the acoustic characteristics of the environment includes determining that values of a subset of the tuning parameters do not correspond to an expected statistical distribution; and
- upon detecting that modification of digital audio signals based on the tuning parameters cannot fully compensate for the acoustic characteristics of the environment, provide an indication that the audio system should be calibrated to adjust the tuning parameters to the environment.

3. An audio system comprising
- at least one microphone for capturing audio from an environment;
- at least one loudspeaker for presenting audio to the environment; and
- a processor operable to modify digital audio signals based on a plurality of tuning parameters to compensate for acoustic characteristics of the environment, the digital audio signals corresponding to at least one of audio captured from the environment and audio to be presented in the environment, wherein the processor is further operable to:

detect, based on at least one of a particular digital audio signal corresponding to audio captured from the environment and values of the tuning parameters, that modification of digital audio signals based on the tuning parameters cannot fully compensate for the acoustic characteristics of the environment, wherein detecting that modification of digital audio signals based on the tuning parameters cannot fully compensate for the acoustic characteristics of the environment includes determining that values of a subset of the tuning parameters correspond to an unexpected statistical distribution; and upon detecting that modification of digital audio signals based on the tuning parameters cannot fully compensate for the acoustic characteristics of the environment, provide an indication that the audio system should be calibrated to adjust the tuning parameters to the environment.

4. An audio system comprising:

at least one microphone for capturing audio from an environment;

at least one loudspeaker for presenting audio to the environment; and a processor operable to modify digital audio signals based on a plurality of tuning parameters to compensate for acoustic characteristics of the environment, the digital audio signals corresponding to at least one of audio captured from the environment and audio to be presented in the environment, wherein the processor is further operable to:

detect, based on at least one of a particular digital audio signal corresponding to audio captured from the environment and values of the tuning parameters, that modification of digital audio signals based on the tuning parameters cannot fully compensate for the acoustic characteristics of the environment; and upon detecting that modification of digital audio signals based on the tuning parameters cannot fully compensate for the acoustic characteristics of the environment, provide an indication that the audio system should be calibrated to adjust the tuning parameters to the environment, wherein detecting that modification of digital audio signals based on the tuning parameters cannot fully compensate for the acoustic characteristics of the environment includes at least one of:

comparing values of ones of the tuning parameters to default values, and determining, based on the comparing, that at least a threshold number of the ones of the tuning parameters are set to default values;

determining that values of a subset of the tuning parameters do not correspond to an expected statistical distribution;

determining that values of a subset of the tuning parameters correspond to an unexpected statistical distribution; or determining that a coherence between a far-side reference signal and the particular digital audio signal is less than a threshold.

5. An audio system comprising:

at least one microphone for capturing audio from an environment;

at least one loudspeaker for presenting audio to the environment; and a processor operable to modify digital audio signals based on a plurality of tuning parameters to compensate for acoustic characteristics of the environment, the digital audio signals corresponding to at least one of audio captured from the environment and audio to be presented in the environment, wherein the audio system is adapted to perform echo cancellation on a particular digital audio signal corresponding to audio captured from the environment and wherein performing echo cancellation includes measuring a coherence between a far-side reference signal and the particular digital audio signal, and wherein the processor is further operable to:

detect, based on at least one of the particular digital audio signal and values of the tuning parameters, that modification of digital audio signals based on the tuning parameters cannot fully compensate for the acoustic characteristics of the environment, wherein detecting that modification of digital audio signals based on the tuning parameters cannot fully compensate for the acoustic characteristics of the environment includes determining that the coherence is less than a threshold; and upon detecting that modification of digital audio signals based on the tuning parameters cannot fully compensate for the acoustic characteristics of the environment, provide an indication that the audio system should be calibrated to adjust the tuning parameters to the environment.

6. The audio system of claim 4, wherein detecting that modification of digital audio signals based on the tuning parameters cannot fully compensate for the acoustic characteristics of the environment includes:

measuring a signal-to-noise ratio of the particular digital audio signal corresponding to audio captured from the environment; and determining that the signal-to-noise ratio is less than a threshold.

7. A computer-implemented method comprising:

detecting, based on at least one of a particular digital audio signal corresponding to audio captured from an environment by an audio system and values of tuning parameters for use in modifying digital audio signals to compensate for acoustic characteristics of the environment, that modification of digital audio signals based on the tuning parameters cannot fully compensate for the acoustic characteristics of the environment; and upon detecting that modification of digital audio signals based on the tuning parameters cannot fully compensate for the acoustic characteristics of the environment, providing an indication that the audio system should be calibrated to adjust the tuning parameters to the environment, wherein detecting that modification of digital audio signals based on the tuning parameters cannot fully compensate for the acoustic characteristics of the environment includes:

comparing values of ones of the tuning parameters to default values; and determining, based on the comparing, that at least a threshold number of the ones of the tuning parameters are set to default values.

8. A computer-implemented method comprising:

detecting, based on at least one of a particular digital audio signal corresponding to audio captured from an environment by an audio system and values of tuning parameters for use in modifying digital audio signals to compensate for acoustic characteristics of the environment, that modification of digital audio signals based on the tuning parameters cannot fully compensate for the acoustic characteristics of the environment; and upon detecting that modification of digital audio signals based on the tuning parameters cannot fully compensate for the acoustic characteristics of the environment, providing an indication that the audio system should be calibrated to adjust the tuning parameters to the environment, wherein detecting that modification of digital audio signals based on the tuning parameters cannot fully compensate for the acoustic characteristics of the environment includes determining that values of a subset of the tuning parameters do not correspond to an expected statistical distribution.

9. A computer-implemented method comprising:

detecting, based on at least one of a particular digital audio signal corresponding to audio captured from an environment by an audio system and values of tuning parameters for use in modifying digital audio signals to compensate for acoustic characteristics of the environment, that modification of digital audio signals based on the tuning parameters cannot fully compensate for the acoustic characteristics of the environment; and upon detecting that modification of digital audio signals based on the tuning parameters cannot fully compensate for the acoustic characteristics of the environment, providing an indication that the audio system should be calibrated to adjust the tuning parameters to the environment, wherein detecting that modification of digital audio signals based on the tuning parameters cannot fully compensate for the acoustic characteristics of the environment includes at least one of:

comparing values of ones of the tuning parameters to default values, and determining, based on the comparing, that at least a threshold number of the ones of the tuning parameters are set to default values;

determining that values of a subset of the tuning parameters do not correspond to an expected statistical distribution;

determining that values of a subset of the tuning parameters correspond to an unexpected statistical distribution; or determining that a coherence between a far-side reference signal and the particular digital audio signal is less than a threshold.

10. A computer-implemented method comprising:

detecting, based on at least one of a particular digital audio signal corresponding to audio captured from an environment by an audio system and values of tuning parameters for use in modifying digital audio signals to compensate for acoustic characteristics of the environment, that modification of digital audio signals based on the tuning parameters cannot fully compensate for the acoustic characteristics of the environment;

upon detecting that modification of digital audio signals based on the tuning parameters cannot fully compensate for the acoustic characteristics of the environment, providing an indication that the audio system should be calibrated to adjust the tuning parameters to the environment; and performing echo cancellation on the particular digital audio signal, where performing echo cancellation includes measuring a coherence between a far-side reference signal and the particular digital audio signal, wherein detecting that modification of digital audio signals based on the tuning parameters cannot fully compensate for the acoustic characteristics of the environment includes determining that the coherence is less than a threshold.

11. The method of claim 9, wherein detecting that modification of digital audio signals based on the tuning parameters cannot fully compensate for the acoustic characteristics of the environment includes:

measuring a signal-to-noise ratio of the particular digital audio signal corresponding to audio captured from the environment; and determining that the signal-to-noise ratio is less than a threshold.

12. The audio system of claim 1 wherein providing the indication that the audio system should be calibrated includes at least one of providing an audible indication via the at least one loudspeaker, providing a visual indication, sending a message via a network using a communications device, or configuring the audio system to present audio at a reduced volume.

13. The audio system of claim 2, wherein providing the indication that the audio system should be calibrated includes at least one of providing an audible indication via the at least one loudspeaker, providing a visual indication, sending a message via a network using a communications device, or configuring the audio system to present audio at a reduced volume.

14. The audio system of claim 3, wherein providing the indication that the audio system should be calibrated includes at least one of providing an audible indication via the at least one loudspeaker, providing a visual indication, sending a message via a network using a communications device, or configuring the audio system to present audio at a reduced volume.

15. The audio system of claim 5, wherein providing the indication that the audio system should be calibrated includes at least one of providing an audible indication via the at least one loudspeaker, providing a visual indication, sending a message via a network using a communications device, or configuring the audio system to present audio at a reduced volume.

16. The audio system of claim 4, wherein providing the indication that the audio system should be calibrated includes at least one of providing an audible indication, providing a visual indication, sending a message via a network, or configuring the audio system to present audio at a reduced volume.

17. The method of claim 7, wherein providing the indication that the audio system should be calibrated includes at least one of providing an audible indication, providing a visual indication, sending a message via a network, or configuring the audio system to present audio at a reduced volume.

18. The method of claim 8, wherein providing the indication that the audio system should be calibrated includes at least one of providing an audible indication, providing a visual indication, sending a message via a network, or configuring the audio system to present audio at a reduced volume.

19. The method of claim 9, wherein providing the indication that the audio system should be calibrated includes at least one of providing an audible indication, providing a visual indication, sending a message via a network, or configuring the audio system to present audio at a reduced volume.

20. The method of claim 10, wherein providing the indication that the audio system should be calibrated includes at least one of providing an audible indication, providing a visual indication, and sending a message via a network, or configuring the audio system to present audio at a reduced volume.

* * * * *